US012426518B2

(12) United States Patent
Li et al.

(10) Patent No.: US 12,426,518 B2
(45) Date of Patent: Sep. 23, 2025

(54) CONDUCTIVE OXIDE DIFFUSION BARRIER FOR LASER CRYSTALLIZATION

(71) Applicant: INTERNATIONAL BUSINESS MACHINES CORPORATION, Armonk, NY (US)

(72) Inventors: Ning Li, White Plains, NY (US); Fabio Carta, Pleasantville, NY (US); Devendra K. Sadana, Pleasantville, NY (US); Tze-Chiang Chen, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/718,077

(22) Filed: Dec. 17, 2019

(65) Prior Publication Data
US 2021/0184113 A1    Jun. 17, 2021

(51) Int. Cl.
*H10N 70/20* (2023.01)
*H10B 63/00* (2023.01)
*H10N 70/00* (2023.01)

(52) U.S. Cl.
CPC ........... *H10N 70/235* (2023.02); *H10B 63/20* (2023.02); *H10N 70/011* (2023.02); *H10N 70/841* (2023.02)

(58) Field of Classification Search
CPC .. H10N 70/235; H10N 70/841; H10N 70/011; H10B 63/20; H01L 45/065; H01L 27/2409; H01L 45/1253; H01L 45/16
USPC .......................................................... 257/4
See application file for complete search history.

(56) References Cited

U.S. PATENT DOCUMENTS

| 2,967,115 | A | 1/1961 | Carlyle | |
|---|---|---|---|---|
| 7,683,418 | B2 | 3/2010 | Park et al. | |
| 8,395,140 | B2* | 3/2013 | Ramaswamy | H01L 45/145 257/5 |
| 8,747,626 | B2 | 6/2014 | Ding et al. | |
| 9,190,321 | B2 | 11/2015 | Cabral, Jr. et al. | |
| 2003/0178630 | A1* | 9/2003 | Maruyama | H01L 31/202 257/98 |
| 2003/0222223 | A1* | 12/2003 | Kamei | G01N 21/255 250/216 |
| 2004/0159868 | A1* | 8/2004 | Rinerson | H01L 45/1233 257/295 |

(Continued)

FOREIGN PATENT DOCUMENTS

CN 106282925 B  8/2018
FR    1235687 A * 7/1960 ............. C23C 16/24

(Continued)

OTHER PUBLICATIONS

English Abstract and Front Page of FR-1235687 (Jul. 1960).*

(Continued)

*Primary Examiner* — Nathan W Ha
(74) *Attorney, Agent, or Firm* — CHIP LAW GROUP

(57) ABSTRACT

A cross-point memory semiconductor structure and a method of creating the same are provided. There is a first electrode layer on top of the substrate. A conductive oxide diffusion barrier layer is on top of the first electrode. A polycrystalline silicon diode is on top of the conductive oxide diffusion barrier. A phase change material (PCM) layer is on top of the polycrystalline silicon diode. A second electrode is on top of the PCM layer.

16 Claims, 6 Drawing Sheets

(56) References Cited

U.S. PATENT DOCUMENTS

| | | | |
|---|---|---|---|
| 2004/0160819 A1* | 8/2004 | Rinerson | G11C 13/0007 365/171 |
| 2005/0174835 A1* | 8/2005 | Rinerson | H01L 45/146 365/171 |
| 2006/0050598 A1* | 3/2006 | Rinerson | H01L 45/146 365/232 |
| 2006/0171200 A1* | 8/2006 | Rinerson | G11C 11/5685 365/185.1 |
| 2006/0226409 A1* | 10/2006 | Burr | H01L 45/1246 257/2 |
| 2006/0261321 A1* | 11/2006 | Happ | H01L 45/1675 257/1 |
| 2008/0150084 A1 | 6/2008 | Hacke et al. | |
| 2009/0142524 A1* | 6/2009 | Mehrtens | C23C 16/45523 428/34.4 |
| 2010/0237320 A1* | 9/2010 | Nagashima | H01L 27/2409 257/E21.602 |
| 2010/0288354 A1 | 11/2010 | Mills et al. | |
| 2012/0007037 A1* | 1/2012 | Ramaswamy | H01L 45/04 257/5 |
| 2013/0134374 A1* | 5/2013 | Kim | H01L 27/2436 257/2 |
| 2013/0341181 A1* | 12/2013 | Park | C23C 14/086 204/298.13 |
| 2014/0158963 A1* | 6/2014 | Shepard | H01L 45/14 257/1 |
| 2014/0264236 A1* | 9/2014 | Kim | H01L 45/1233 257/4 |
| 2015/0380642 A1* | 12/2015 | Rinerson | H01L 45/1253 257/4 |
| 2018/0341849 A1* | 11/2018 | Brew | G11C 13/004 |

FOREIGN PATENT DOCUMENTS

| | | | | |
|---|---|---|---|---|
| JP | 2012004586 A | * | 1/2012 | H01L 27/101 |
| JP | 2014120606 A | * | 6/2014 | |
| KR | 10-2015-0071553 A | | 6/2015 | |

OTHER PUBLICATIONS

English (Machine) Translation of JP-2014-120606-A , No Date.*
Merriam-Webster Definition of Action. No Date!*
Merriam-Webster Definition of Function. No Date!*
Merriam-Webster Definition of Configure. No Date!*
Merriam-Webster Definition of Operate. No Date!*
Merriam Webster OnLine Dictionary Definition of "Is." No Date.*
Xia, R. et al., "Precision Excimer Laser Annealed Ga-doped ZnO Electron Transport Layers for Perovskite Solar Cells"; RSC Adv. (2018); vol. 8, pp. 17694-17701.
Dowan, B. et al., "Fabrication of High Efficiency Flexible CIGS Solar Cell with ZnO Diffusion Barrier on Stainless Steel Substrate"; Cambridge Core (2011); 3 pgs.
Lin et al. "High mobility transparent conductive Al-doped ZnO thin films by atomic layer deposition", Journal of Alloys and Compounds, Dec. 15, 2017, pp. 565-571, vol. 727.

* cited by examiner

CONDUCTIVE OXIDE DIFFUSION BARRIER FOR LASER CRYSTALLIZATION

BACKGROUND

Technical Field

The present disclosure generally relates to semiconductor devices, and more particularly, to cross-point phase change memory devices and methods of manufacturing the same.

Description of the Related Art

In recent years, the proliferation of computing technology and digital services has ushered in large amounts of data. To make such data practical, it should be stored and quickly accessible. The electronics industry evaluates different ways to reduce the lag time between the processor and such data to allow fast analysis. Cross-point memory provides a storage solution that is fast, non-volatile, and relatively inexpensive.

SUMMARY

In various embodiments, a memory cell and a method of manufacturing the same are provided. A substrate is provided. A first electrode layer is provided on top of the substrate. A conductive oxide diffusion barrier layer is provided on top of the first electrode. A polycrystalline silicon diode is provided on top of the conductive oxide diffusion barrier. A phase change material (PCM) layer is provided on top of the polycrystalline silicon diode. A second electrode is provided on top of the PCM layer.

In one embodiment, the first electrode is a word line for the memory cell. The first electrode may comprise tungsten (W).

In one embodiment, the polycrystalline silicone diode is an amorphous $SiO_2$ layer that is laser annealed to create the conductive oxide diffusion barrier. The resistivity of the conductive oxide diffusion barrier can be reduced during the annealing.

In one embodiment, the second electrode is a bit line for the memory cell.

In one embodiment, the memory cell is part of a 3D cross-point memory array.

In one embodiment, the resistivity of the PCM layer changes based on an induced phase of the PCM layer.

In one embodiment, the conductive oxide diffusion barrier comprises gallium (Ga) doped Zink Oxide (ZnO).

In one embodiment, the conductive oxide diffusion barrier has a thickness of approximately 5 nm.

The techniques described herein may be implemented in a number of ways. Example implementations are provided below with reference to the following figures.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

DETAILED DESCRIPTION

Overview

Figure 1:
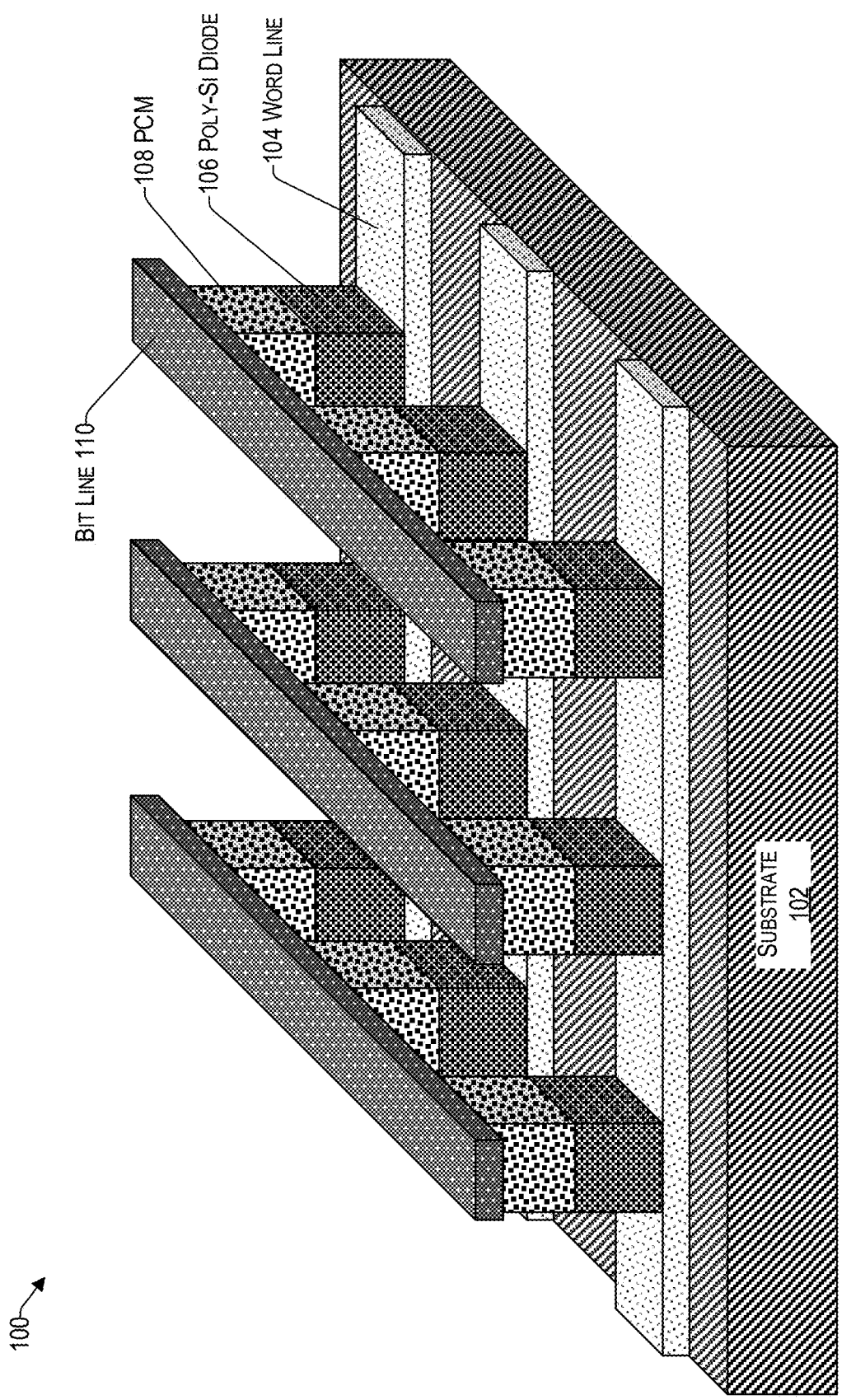
FIG. 1 provides a perspective view of a portion of a cross-point memory array, consistent with an illustrative embodiment.

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

In one aspect, spatially related terminology such as "front," "back," "top," "bottom," "beneath," "below," "lower," above," "upper," "side," "left," "right," and the like, may be used with reference to the orientation of the Figures being described. Since components of embodiments of the disclosure can be positioned in a number of different orientations, the directional terminology is used for purposes of illustration and is in no way limiting. Thus, it will be understood that the spatially relative terminology is intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

As used herein, the terms "lateral" and "horizontal" describe an orientation parallel to a first surface of a semiconductor substrate or semiconductor body. For example, substrate can be the surface of a wafer or a die.

As used herein, the term "vertical" describes an orientation that is arranged perpendicular to the first surface of the semiconductor substrate or semiconductor body.

As used herein, the terms "coupled" and/or "electrically coupled" are not meant to mean that the elements must be directly coupled together—intervening elements may be provided between the "coupled" or "electrically coupled" elements. In contrast, if an element is referred to as being "directly connected" or "directly coupled" to another element, there are no intervening elements present. The term "electrically connected" refers to a low-ohmic electric connection between the elements electrically connected together.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

Example embodiments are described herein with reference to cross-sectional illustrations that are schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope.

It is to be understood that other embodiments may be used and structural or logical changes may be made without departing from the spirit and scope defined by the claims. The description of the embodiments is not limiting. In particular, elements of the embodiments described hereinafter may be combined with elements of different embodiments.

The present disclosure relates to cross-point memory with an advanced diffusion barrier to facilitate better performance. Cross-point memory is generally defined by a resistive element occurring at an intersection of two conductive lines, e.g., an access line (commonly referred to as a word line) and a data line (commonly referred to as a bit line). FIG. 1 provides a perspective view of a portion of a cross-point memory array 100, consistent with an illustrative embodiment. The cross-point memory array 100 has memory cells that are embodied at intersections of the access lines (such as word line 104) and the data lines (such as bit line 110).

Each memory cell of the cross-point memory array 100 includes a resistive element coupled between an access line and a data line, sometimes referred to herein as a phase chance material (PCM) (e.g., PCM 108). Further, each memory cell includes a diode 106 coupled between the PCM 108 and the access line 104.

Differences in resistivity of the PCM 108 define the data value for each memory cell. For example, memory cells having a resistive element (e.g., PCM 108) with a relatively higher resistivity may identify one data value, such as a logic 0, while memory cells having a resistive element (e.g., 108) with a relatively lower resistivity may identify a different data value, such as a logic 1. The resistivity of a PCM can be modified by changing its phase from crystalline to amorphous, thereby changing the resistance by orders of magnitude. For example, a pulse can be sent to the PCM 108 by selecting the word line 104 and applying a pulse to the bit line 110.

The state of the resistive element 108 can be determined by applying a potential difference (e.g., voltage) across the access line 104 and data line 110. The resulting current flow between the two lines can be sensed to determine whether the memory cell occurring at that intersection has the relatively higher or relatively lower resistance, and thus stores a logic 0 or a logic 1. In some scenarios, differing resistivity values may be used to define more than two data states.

The cross-point memory depicted in FIG. 1 is typically very space efficient, providing high memory density compared to other memory technologies. In various embodiments, the access lines and data lines can be formed in a substantially perpendicular intersecting pattern, as illustrated in FIG. 1, or may be non-perpendicular.

Using a diode 106 between the access line (e.g., 104) and the data line (e.g., 110) provides the largest amount of current for a given cell size. However, the concern with a diode relates to the parasitic currents to neighboring cells, as well as a higher voltage requirement, resulting in higher power consumption. In one aspect, a consequence of using a diode-selected array, in particular for large arrays, is the total reverse bias leakage current from the unselected bit lines. By way of contrast, in transistor-selected arrays, only the selected bit lines contribute reverse bias leakage current.

The leakage of the diode is strongly affected by the quality of the diode itself. What is desired is a very sharp ON/OFF characteristic of the diode. Applicants have identified that the process during which the diode is created in known devices may actually degrade the ON/OFF characteristic of the diode. That is because the material of the word line 104 may diffuse into the material of the diode 106. Accordingly, what is disclosed herein is an improved diode structure for cross-point memory that does not degrade during processing.

The techniques described herein may be implemented in a number of ways. Example implementations are provided below with reference to the following figures.

Example Cross-Point Memory

Figure 2:
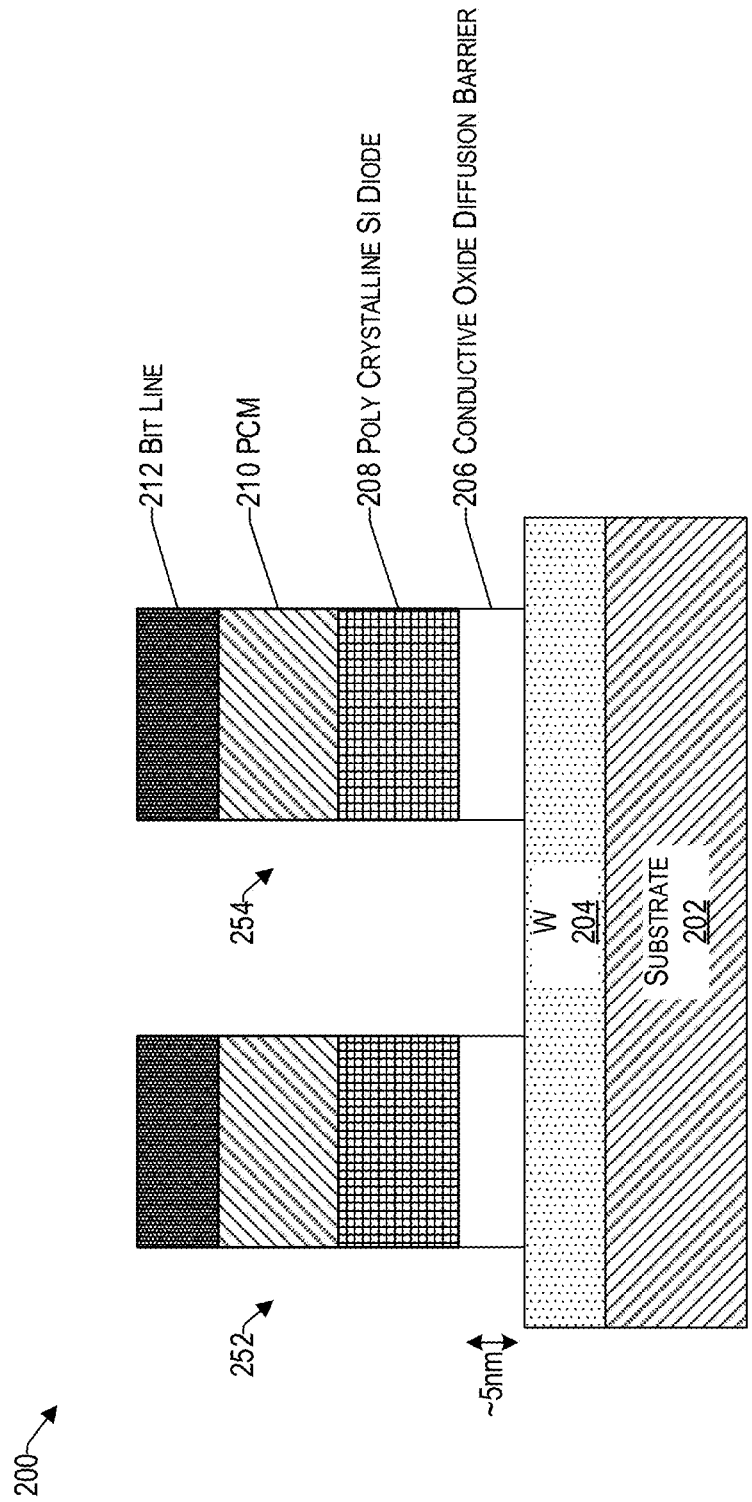
FIG. 2, which is a simplified cross-section view of a cross-point memory, consistent with an illustrative embodiment.

Reference now is made to FIG. 2, which is a simplified cross-section view of a cross-point memory, consistent with an illustrative embodiment. The semiconductor structure 200 may include a substrate 202. In various embodiments, the substrate 202, may comprise any suitable material or combination of materials, such as doped or undoped silicon, glass, dielectrics, etc. For example, the substrate may comprise a semiconductor-on-insulator (SOI) structure, e.g., with a buried insulator layer, or a bulk material substrate, e.g., with appropriately doped regions, typically referred to as wells. In another embodiment, the substrate may be silicon with silicon oxide, nitride, or any other insulating films on top.

Other materials that may be used for the substrate include, without limitation, sapphire, aluminum oxide, germanium, gallium arsenide (GaAs) or any of the other III-V periodic table compounds, indium phosphide (InP), silicon carbide (SiC), an alloy of silicon and germanium, etc. The substrate 202 can act as a conductor or an insulator, depending on the materials and concentrations chosen. Thus, as used herein, the term substrate 202 refers to a foundation upon which various semiconductor structures can be built.

There is a first electrode layer 204 on top of the substrate 202. In one embodiment, the first electrode layer is tungsten (W). The first electrode layer can be used as the access (e.g., word) line to the first and second cross-point memory nodes (252, 254). It will be understood that other conductive materials, such as metals, metal alloys, conductive metal nitrides, other conductive materials, or a combination thereof may be used for the word line 204.

There is a conductive oxide diffusion barrier 206 on top of the first electrode layer 204. In some embodiments, the conductive oxide diffusion barrier is approximately 5 nm in thickness.

There is a polysilicon diode 208 on top of the conductive oxide diffusion barrier 206. There is a PCM layer 210 on top of the polysilicon diode 208. There is a second electrode layer 212 on top of the PCM layer 210. The second electrode layer 212 can be used as a data line, sometimes referred to herein as the bit-line of the corresponding memory node. The second electrode layer 212 can be any suitable metal, such as, without limitation, aluminum or copper.

Unlike conventional diffusion barriers, such as Ti, TiN, PVD TaN, ALD TaN, Co, NiPt, C, Mo, WN, the diffusion barrier 206 is configured to substantially prevent diffusion into the material of the diode 208. Such diffusion typically occurs during annealing such that the grain size of the silicon layer is enlarged and the layer behaves more as a "single-crystal silicon," thereby improving the quality of the silicon layer, and by extension the performance of the diode 208. For example, the leakage in the diode is reduced and the ON/OFF characteristic is sharper.

Annealing is a process of reforming the surfaces of materials by first heating the surface and then cooling it. In various embodiments different types of heating can be used, including furnaces, lamps, and/or laser annealing. Laser annealing, performs annealing using a laser, where the surface is rapidly heated and allowed to self-cool, thereby improving the quality of the grain size of the silicon diode 208. For example, the low temperature heating by laser annealing heats the surface of the material quickly and allows it to cool down on its own, thereby avoiding issues caused by high temperature heating in a furnace. By virtue of using the conductive oxide diffusion barrier comprising gallium (Ga) doped Zink Oxide (ZnO) 206 discussed herein, the diffusion of silicon 208 into the first electrode layer 204 (W) is mitigated, while allowing large laser power to be used to improve the quality of the polysilicon diode 208. For example, an excimer laser can be used to deliver ultra-short pulses to increase the peak power high enough to locally melt the a-Si (e.g., >1420K).

Applicants have identified that as laser pulse energy to Ga doped ZnO increases (e.g., represented by an increased number of pulses), the resistivity of the Ga doped ZnO goes down, thereby improving the quality of the conductive oxide diffusion barrier 206. In this way, the resistance of the additional conductive oxide diffusion barrier is reduced 206 and the performance of the cross-point memory is improved.

Example Process for a Cross-Point Memory

Figure 3:
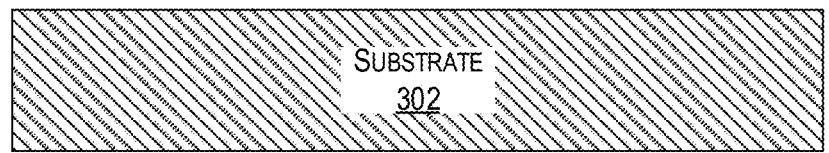
FIG. 3 illustrates a semiconductor structure that includes a substrate.

With the foregoing description of the structure of an example cross-point memory array 100, it may be helpful to discuss an example process of manufacturing the same. To that end, FIGS. 3 to 9 illustrate various steps in the manufacture of a cross-point memory semiconductor structure, consistent with exemplary embodiments. In particular, FIG. 3 illustrates a semiconductor structure 300 that may have undergone some semiconductor processing steps. The process begins with a substrate 302, which may be insulating. The substrate may comprise any suitable material or combination of materials, such as doped or undoped silicon, glass, etc.

In one embodiment, the substrate may comprise a semiconductor-on-insulator (SOI), e.g., with a buried insulator layer, or a bulk material substrate. The insulator layer (not shown) may comprise any suitable electrical insulator material, such as $SiO_2$, SiN, etc., and may be formed using conventional semiconductor processing techniques, such as thermal oxidation, chemical vapor deposition (CVD), physical vapor deposition (PVD), electrochemical deposition (ECD), molecular beam epitaxy (MBE), atomic layer deposition (ALD), etc.

Figure 4:
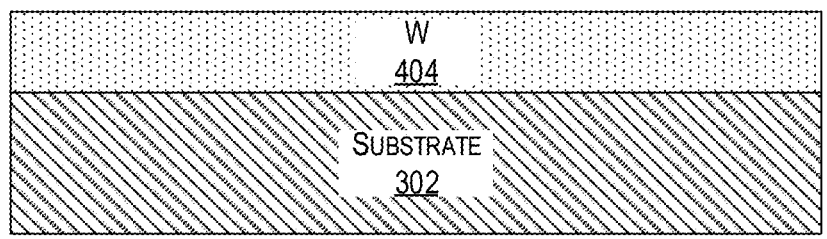
FIG. 4 illustrates a semiconductor structure where a first electrode layer is deposited on the substrate.

FIG. 4 illustrates a semiconductor structure 400, where a first electrode layer 404 is deposited on the substrate 302. The first electrode layer 404 can be used as the access (e.g., word) line for one or more memory nodes of the cross-point memory. In one embodiment, the first electrode layer 404 is W. The material of the first electrode 404 is configured to be electrically conductive and may comprise any suitable material or combination of materials. For example, in other embodiments, the first electrode 404 may comprise graphene, aluminum (Al), titanium (Ti), platinum (Pt), and/or gold (Au), or a combination thereof. The first electrode may be formed using conventional semiconductor processing techniques, such as electron beam evaporation combined with a lift-off process, sputtering. Other suitable materials and/or formation processes are within the scope of the present disclosure.

Figure 5:
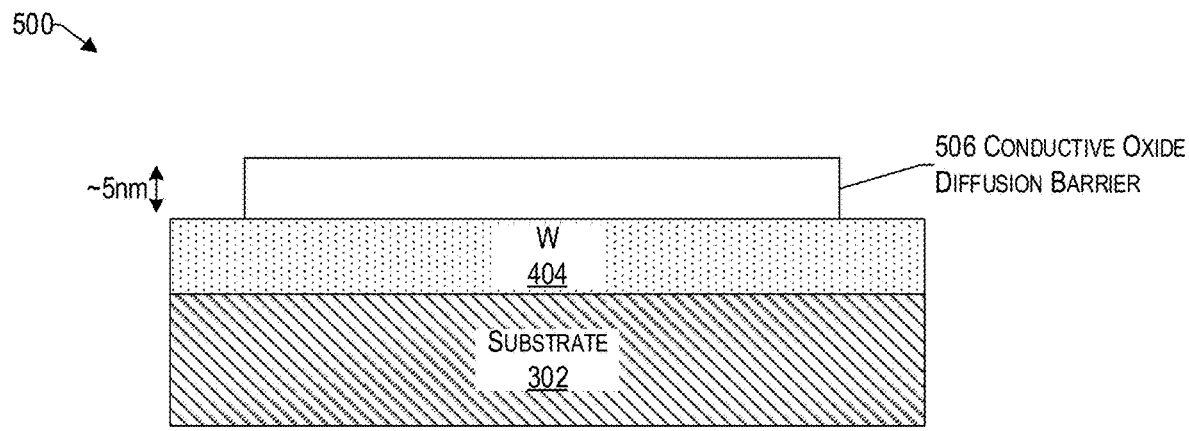
FIG. 5 illustrates a semiconductor structure where a conductive oxide diffusion barrier layer is deposited.

FIG. 5 illustrates a semiconductor structure 500 where a conductive oxide diffusion barrier layer is deposited. The conductive oxide diffusion barrier 506 may be formed using conventional semiconductor processing techniques including, but not limited to, atomic layer deposition (ALD), sputtering, etc. The resulting thickness of the conductive oxide diffusion barrier 506 may be 3 nm to 10 nm thick, although other thicknesses, materials, and/or formation processes may be used depending on the application of the cross-point memory.

Figure 6:
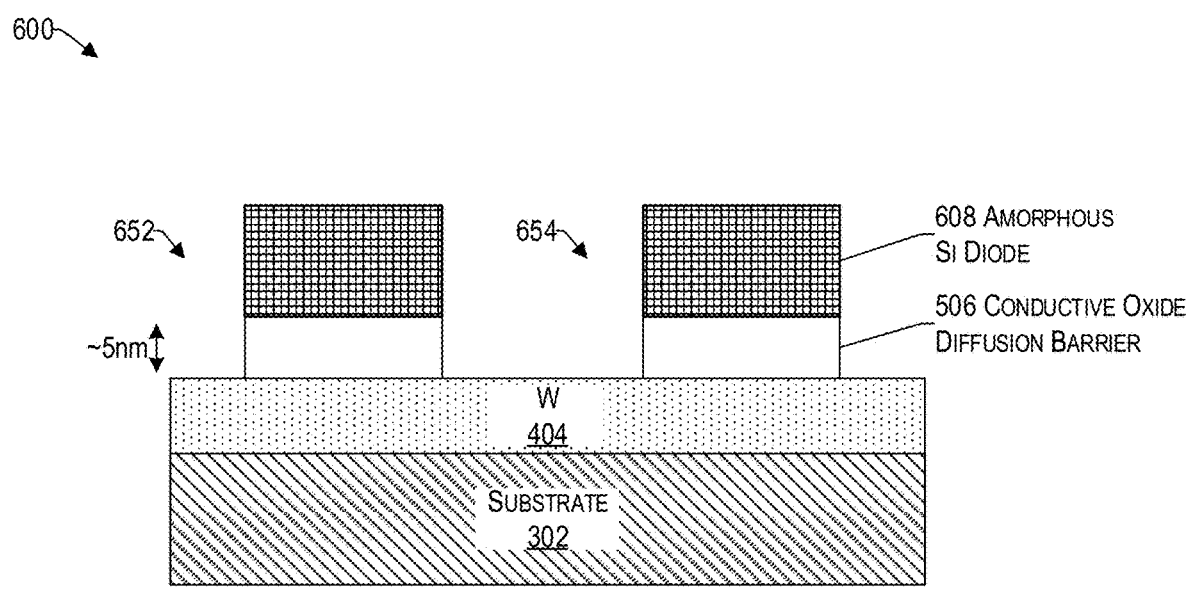
FIG. 6 illustrates a semiconductor structure where an amorphous $SiO_2$ layer is deposited on top of the conductive oxide diffusion barrier.

FIG. 6 illustrates a semiconductor structure 600 where an amorphous $SiO_2$ layer 608 is deposited on top of the conductive oxide diffusion barrier 506. The amorphous $SiO_2$ layer 608 layer may be formed using conventional semiconductor processing techniques including, but not limited to, plasma enhanced chemical vapor deposition (PECVD).

In some embodiments, the amorphous $SiO_2$ layer 608, the conductive oxide diffusion barrier and first electrode layer 404 are patterned to support multiple word and bit lines. To that end, in some embodiments, etching mask layer(s) may be provided, and the layers that are not protected thereby are removed. For example, as is understood by those of ordinary skill in the art, a mask layer (not shown), sometimes referred to as a photomask, may be provided by forming a layer of photoresist material on the amorphous $SiO_2$ layer 506, exposing the photoresist material to a pattern of light, and developing the exposed photoresist material. An etching process, such as a reactive ion etch (ME), may be used to form patterns (e.g., openings) by removing portions of the amorphous $SiO_2$ layer 506 and conductive oxide diffusion barrier 506, up to the top surface of the first electrode layer 404 (e.g., W). After etching, the mask layer may be removed using a conventional plasma ashing or stripping process. Accordingly, the pattern of the mask layer facilitates the removal of the amorphous $SiO_2$ layer 608 and conductive oxide diffusion barrier 506, in areas where the mask layer 310 has not been deposited, thereby leaving behind two regions 652 and 654. A similar process may be used to pattern the first electrode layer 404 (e.g., before the conductive oxide diffusion barrier 506 is provided thereon).

Figure 7:
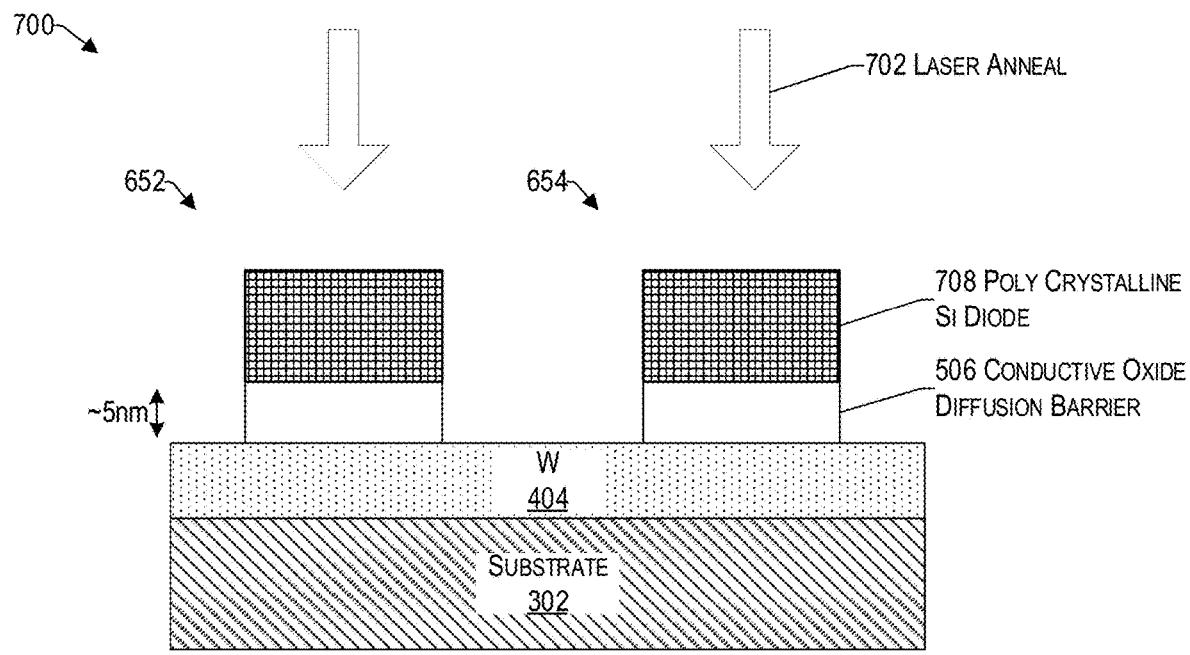
FIG. 7 illustrates a semiconductor structure where an excimer anneals the amorphous $SiO_2$ layer to transform it into a polycrystalline silicone diode layer.

FIG. 7 illustrates a semiconductor structure 700 where an excimer 702 anneals the amorphous $SiO_2$ layer 608 to transform it into a polycrystalline silicone diode layer 708.

Figure 8:
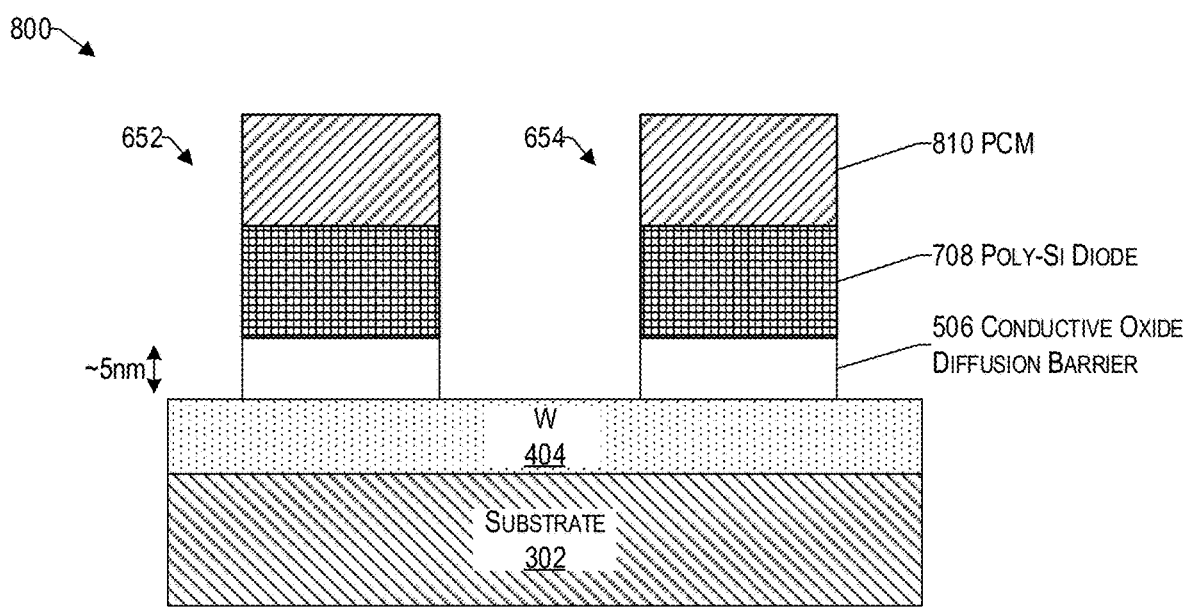
FIG. 8 illustrates a semiconductor structure where a phase change material layer is provided on top of the polysilicon diode layer.

FIG. 8 illustrates a semiconductor structure 800 where a PCM layer is provided on top of the polysilicon diode layer 708 in regions 652 and 654.

Figure 9:
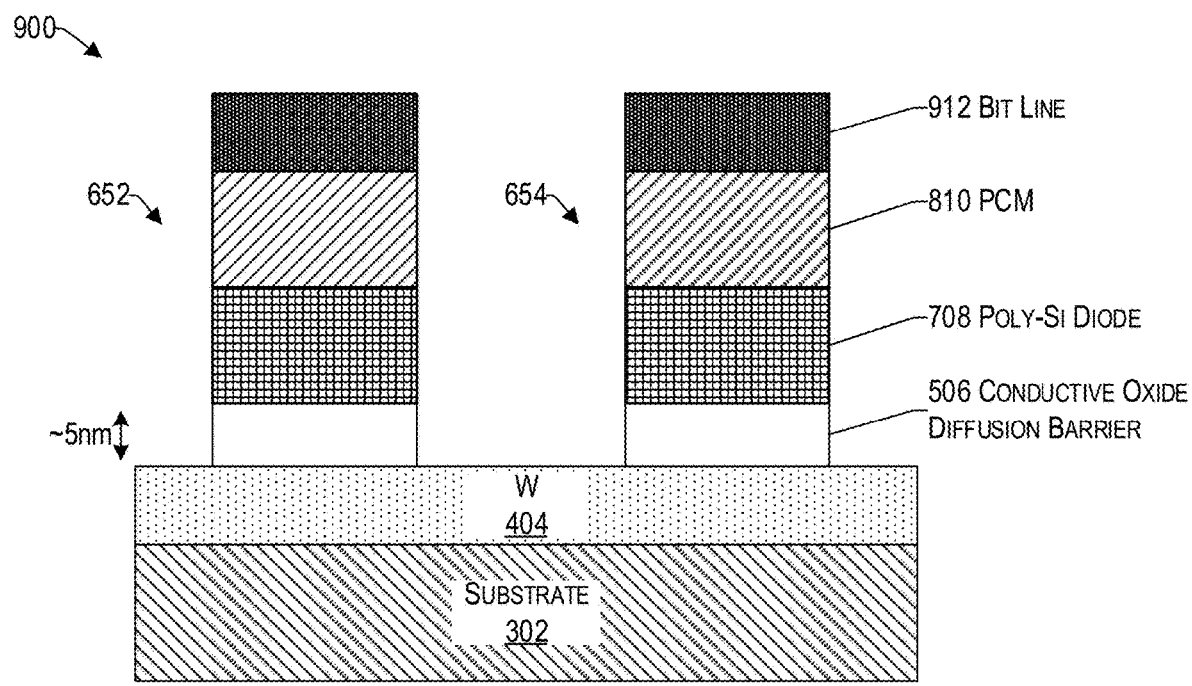
FIG. 9 illustrates a semiconductor structure where a second electrode layer is provided on top of the phase change material layer.

FIG. 9 illustrates a semiconductor structure 900 where a second electrode layer 912 is provided on top of the PCM layer 810 in regions 652 and 654. The second electrode layer 912 can be used as data lines (e.g., bit lines) of the cross-point memory.

While the manufacture of a two dimensional cross-point memory has been described in FIGS. 2 to 9 for simplicity, it will be understood that any desired number of cross-point memory arrays can be formed on top of the structure of FIG. 9 using similar processing steps, thereby creating a three-dimensional cross-point memory structure. Stated differently, additional structures can be further stacked on top of one another using layers and processing steps similar to those discussed above.

The method as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip may be mounted in a single chip package (such as a plastic carrier, with leads that are affixed to a motherboard or other higher-level carrier) or in a multichip package (such as a ceramic carrier that has either or both surface interconnections or buried interconnections). In any case, the chip can then be integrated with other chips, discrete circuit elements, and/or other signal processing devices as part of either (a) an intermediate product, such as a motherboard, or (b) an end product. The end product can be any product that includes integrated circuit chips, ranging from low-end applications, such as toys, to advanced computer products having a display, a keyboard or other input device, and a central processor.

CONCLUSION

The descriptions of the various embodiments of the present teachings have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits, and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A memory cell, comprising:
   a substrate;
   a first electrode layer on top of the substrate;
   a conductive oxide diffusion barrier layer on top of the first electrode, wherein the conductive oxide diffusion barrier comprises gallium (Ga) doped zinc oxide (ZnO) and is configured to prevent a diffusion of the first electrode layer into a polycrystalline silicon diode on top of the conductive oxide diffusion barrier, wherein the polycrystalline silicon diode is laser annealed; and
   a phase change material (PCM) layer on top of the polycrystalline silicon diode; and
   a second electrode on top of the PCM layer.

2. The memory cell of claim 1, wherein the first electrode is a word line for the memory cell.

3. The memory cell of claim 2, wherein the first electrode comprises tungsten (W).

4. The memory cell of claim 1, wherein a resistivity of the conductive oxide diffusion barrier is reduced during the annealing.

5. The memory cell of claim 1, wherein the second electrode is a bit line for the memory cell.

6. The memory cell of claim 1, wherein the memory cell is part of a 3D cross-point memory array.

7. The memory cell of claim 1, wherein a resistivity of the PCM layer changes based on an induced phase of the PCM layer.

8. The memory cell of claim 1, wherein the conductive oxide diffusion barrier has a thickness of approximately 5 nm.

9. A method of fabricating a memory cell, comprising:
providing a substrate;
providing a first electrode layer on top of the substrate;
providing a conductive oxide diffusion barrier layer on top of the first electrode comprising gallium (Ga) doped zinc oxide (ZnO);
configuring a polycrystalline silicon diode on top of the conductive oxide diffusion barrier to prevent a diffusion of the first electrode into a phase change material (PCM) layer on top of the polycrystalline silicon diode;
laser annealing the polycrystalline silicon diode; and
providing a second electrode on top of the PCM layer.

10. The method of claim 9, wherein the first electrode is a word line for the memory cell.

11. The method of claim 10, wherein the first electrode comprises tungsten (W).

12. The method of claim 9, wherein a resistivity of the conductive oxide diffusion barrier is reduced during the annealing.

13. The method of claim 9, wherein the second electrode is a bit line for the memory cell.

14. The method of claim 9, wherein the memory cell is part of a 3D cross-point memory array.

15. The method of claim 9, wherein a resistivity of the PCM layer changes based on an induced phase of the PCM layer.

16. The method of claim 9, wherein the conductive oxide diffusion barrier has a thickness of approximately 5 nm.

* * * * *